(12) United States Patent
Glasscock et al.

(10) Patent No.: US 10,840,211 B2
(45) Date of Patent: Nov. 17, 2020

(54) SEMICONDUCTOR PACKAGE WITH LEADFRAME HAVING PRE-SINGULATED LEADS OR LEAD TERMINALS

(71) Applicant: Texas Instruments Incorporated, Dallas, TX (US)

(72) Inventors: Bradley Andrew Glasscock, Wylie, TX (US); Michael Todd Wyant, Dallas, TX (US); Christopher Daniel Manack, Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/277,462

(22) Filed: Feb. 15, 2019

(65) Prior Publication Data

US 2020/0266133 A1  Aug. 20, 2020

(51) Int. Cl.
| | |
|---|---|
| *H01L 23/52* | (2006.01) |
| *H01L 21/00* | (2006.01) |
| *H01L 23/00* | (2006.01) |
| *H01L 23/495* | (2006.01) |
| *H01L 23/31* | (2006.01) |

(52) U.S. Cl.
CPC ........ *H01L 24/81* (2013.01); *H01L 23/49589* (2013.01); *H01L 24/06* (2013.01); *H01L 24/09* (2013.01); *H01L 23/3114* (2013.01); *H01L 2224/0401* (2013.01); *H01L 2224/1626* (2013.01); *H01L 2224/16151* (2013.01); *H01L 2224/16265* (2013.01); *H01L 2924/19103* (2013.01)

(58) Field of Classification Search
CPC ..................... H01L 23/49589; H01L 23/3114
USPC .......................................... 438/108; 257/778
See application file for complete search history.

(56) References Cited

U.S. PATENT DOCUMENTS

| | | | | |
|---|---|---|---|---|
| 8,072,732 B2* | 12/2011 | Sato | ....................... | H01G 4/232 361/303 |
| 9,023,279 B2* | 5/2015 | Noyes | ..................... | B64D 11/00 296/24.3 |
| 9,818,681 B2* | 11/2017 | Machida | ........... | H01L 23/49827 |
| 2018/0190606 A1 | 7/2018 | Williamson et al. | | |
| 2019/0393297 A1* | 12/2019 | Kung | .................... | H01L 21/563 |

\* cited by examiner

*Primary Examiner* — Calvin Lee
(74) *Attorney, Agent, or Firm* — Ronald O. Neerings; Charles A. Brill; Frank D. Cimino

(57) ABSTRACT

A packaged semiconductor device includes at least one semiconductor die having circuitry with circuit nodes coupled to bond pads that have bonding features thereon. A plurality of leads or lead terminals include at least metal bars, wherein the plurality of leads or lead terminals are exclusive of any saw marks. The semiconductor die is flipchip attached with a bonded connection between respective bonding features and respective leads or lead terminals.

32 Claims, 4 Drawing Sheets

US 10,840,211 B2

SEMICONDUCTOR PACKAGE WITH LEADFRAME HAVING PRE-SINGULATED LEADS OR LEAD TERMINALS

FIELD

This Disclosure relates to packaged semiconductor devices and assembly processes.

BACKGROUND

Multi-chip modules (MCMs) and system in packages (SIPs) are growing in volume each year as they are a way of integrating several application specific integrated circuits (ASICs) with a memory or passive device(s), into a lower-cost, smaller form-factor, robust module that is an alternative to a single large system on a chip (SoC). The leadframe strips (or leadframe panels) for conventional leadframes have metal 'saw streets' which extend in prescribed patterns between the leadframes, that are sawed through after mold encapsulation to provide singulated packaged devices.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize adding discrete passive devices such as capacitors, inductors or resistors inside semiconductor packages such as MCM and SIP packages, which may be generally used for some power devices including for power converters, makes the packaged device larger in size (a larger area and/or a taller height) and thus less cost efficient. This also means more mold compound, more routing connections inside the package, and then adding solder or some other type of electrically conductive paste to connect the leads or lead terminals to land pads on a circuit board (e.g. a printed circuit board (PCB)).

This Disclosure substitutes for a conventional leadframe with a disclosed leadframe comprising a plurality of pre-singulated leads (for a leaded package) or plurality of pre-singulated lead terminals (for a leadless package such as a quad-flat no-leads (QFN) package) that are arranged on a substrate with some adhesion such as a tape to match the location of bond pads of semiconductor die(s). This feature enables the bonding features on the bond pads semiconductor die(s) to be directly attached to the pre-singulated leads or lead terminals, which is used to form a disclosed semiconductor package. The pre-singulated leads or lead terminals comprise a plurality of metal bars along with one or more optional discrete passive devices (e.g., capacitors, inductors or resistors), which are provided adhered to a substrate such as a tape, with the pre-singulated leads or lead terminals being arranged in respective positions on the substrate to match the positions of the bond pads and thus the bonding features on the die(s), which upon a heating such as a bake or reflow form the bonded connections for the semiconductor package. The substrate is then removed.

Disclosed aspects include a packaged semiconductor device that includes at least one semiconductor die having circuitry with circuit nodes coupled to bond pads that have bonding features thereon. A plurality of leads or lead terminals include at least metal bars, wherein the plurality of leads or lead terminals are exclusive of any saw marks. The semiconductor die is flipchip attached with a bonded connection between respective bonding features and respective leads or lead terminals.

BRIEF DESCRIPTION OF THE DRAWINGS

Reference will now be made to the accompanying drawings, which are not necessarily drawn to scale, wherein.

DETAILED DESCRIPTION

Figure 1A:
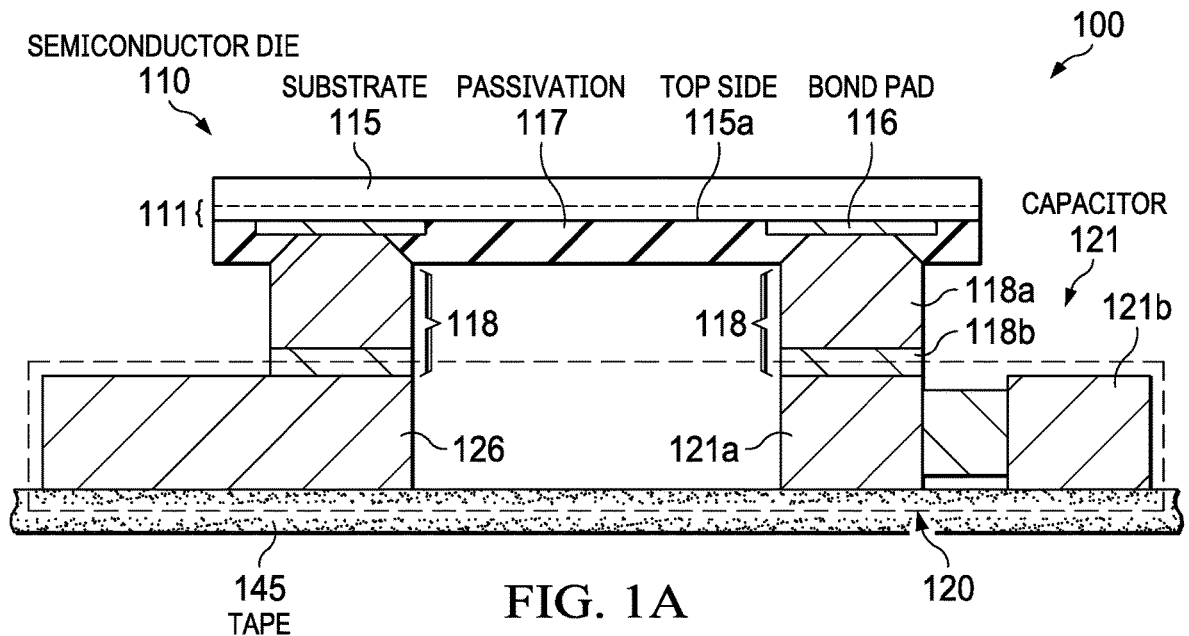
FIG. 1A shows a front view (e.g., showing the width direction of the package) of an in-process disclosed semiconductor package shown by example as a 6 pin package with a leadframe having pre-singulated leads or lead terminals including a plurality of capacitors and metal bars on a tape, along with a semiconductor die top side down thereon after being picked and flipchip placed on the pre-singulated leads or lead terminals. For the capacitor, the bonding feature placement is on one of its metal end caps which provide electrical contact to one of its 2 electrodes.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A shows a front view (e.g., showing the width direction) of an in-process disclosed semiconductor package shown by example as a 6 pin semiconductor package 100. Disclosed semiconductor packages can have as few as 2 pins, and as many as hundreds of pins. The semiconductor package 100 includes a disclosed leadframe 120 with pre-singulated leads or lead terminals shown as pre-singulated leads comprising surface mount (SMT), also known as a Surface Mount Device (SMD), capacitors, with a capacitor 121 shown that includes metal end caps 121a and 121b which provide electrical contact to each of its electrodes, where metal end cap 121b is available for bonding its bottom side to land pads of a PCB, with the other lead terminal is shown as a metal bar 126. The pre-singulated leads are on a substrate shown as a tape 145 along with a semiconductor die 110 positioned top side down on the pre-singulated leads after a pick-and-flipchip place operation.

The semiconductor die comprises a substrate 115 having a top side semiconductor surface 115a that is on pre-singulated leads including a metal bar 126 and the top side of the metal end cap 121a of the first capacitor 121. The semiconductor die 110 also includes bond pads 116 on the top side semiconductor surface 115a with bonding features 118 thereon, that also includes at least one dielectric passivation layer 117 thereon that has apertures over the bond pads 116. The semiconductor die 110 includes circuitry 111 comprising circuit elements (including transistors, and generally diodes, resistors, capacitors, etc.) formed in and on the top side semiconductor surface 115a configured together for generally realizing at least one circuit function. Example circuit functions include analog (e.g., an amplifier or a power converter), radio frequency (RF), digital, or non-volatile memory functions.

Although the semiconductor die 110 is shown with only two bond pads 116 and thus two bonding features 118 in the width direction, the semiconductor die 110 can have more bonding features in the width direction. The bonding features 118 are shown by example as a metal post 118a (e.g., copper) including solder 118b (e.g., SnAg) thereon. The pre-singulated leads 121, 126 are positioned on the tape 145 to match the positions of bond pads 116 and thus the bonding features 118 of the semiconductor die 110, and the semiconductor die 110 is flipchip placed on the pre-singulated leads 121, 126 so that the bonding features 118 are on the pre-singulated leads 121, 126. The tape 145 functions to provide support to the pre-singulated leads or lead terminals as would be provided by a conventional leadframe.

The tape 145 can be part of a tape and reel apparatus that has an associated computing device having an associated memory that includes stored semiconductor die information regarding the number and placement of the bond pads and thus the bonding features on the semiconductor die 110. There will generally be multiple pre-singulated leads or lead terminals picked and placed at a time. The pre-singulated leads or lead terminals provide sufficient planarity to enable the die attach of the semiconductor die 110, generally where the plurality of pre-singulated leads or lead terminals provide a planarity of ≤0.05 mm. The height of the metal bars may be selected to match the height of the passive device(s) if included, such as the capacitors, inductors or resistors. If needed, planarity may also be enhanced by a suitable etch process. The in-process packaged device after semiconductor die placement is then sent through heating such as a bake or reflow process in the case of solder to make the bonding feature 118 to pre-singulated leads 121, 126 bonded connections. Following the heating process, the semiconductor package 100 can be picked off the tape 145. A re-taping process on the die 110 after the heating may be needed to enable this picking off process.

The tape 145 comprises a material that can generally withstand a reflow processing in the case of a solder attachment and comprise an adhesive dicing tape, backgrind tape, or a special sticky (tacky) tape, or generally any tape that is sticky that can withstand the temperature of a solder reflow. For example, a polyimide tape.

Disclosed leadframes comprising pre-singulated leads or lead terminals can be in the form of metal bars of generally any desired shape or configuration to provide lead or lead terminals, or comprise passive devices such as commercially available SMT capacitors, inductors or resistors to provide leads or lead terminals. Most resistors, capacitor, and inductors are that are commercially available are generally in a SMT or SMD form. As for metal bar shapes, a variety of shapes are possible. For example, the metal bars may be L-shaped for a leaded package.

There are multiple options for providing molding for the semiconductor package 100. The semiconductor die 110 can be pre-molded at the wafer level where the whole wafer is molded after die singulation. This ensures 5 or 6 side die molding leaving the ends of the bonding features 118 such as solder capped copper pillars exposed. Another molding method is similar to a QFN molding process where the bottom/sides of the pre-singulated leads or lead terminals would stay exposed after molding, but everywhere else would be molded.

Figure 1B:
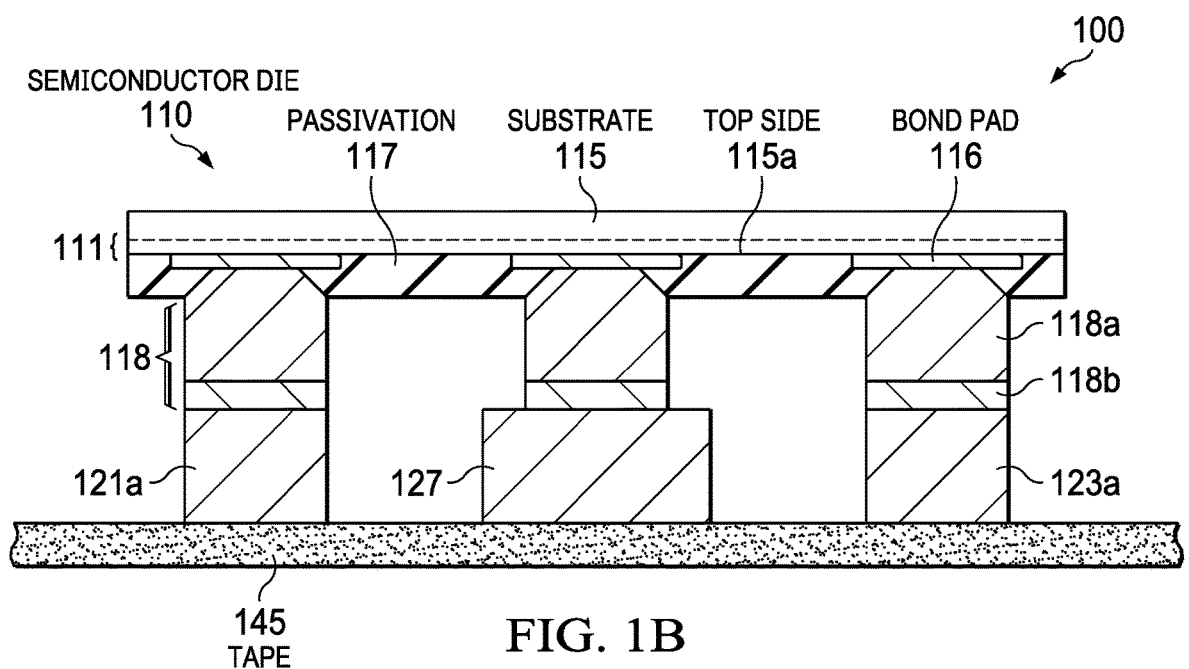
FIG. 1B shows a side view (e.g., showing the length direction of the package) of the in-process semiconductor package shown in FIG. 1A showing its 3 pre-singulated leads or lead terminals comprising a first capacitor, a metal bar, and a second capacitor, all on a tape.

FIG. 1B shows a side view (e.g., showing the length direction of the package) of the in-process semiconductor package 100 shown in FIG. 1A showing its pre-singulated leads or lead terminals in the length direction comprising a metal end cap 121a of a first capacitor, a metal bar 127, and the metal end cap 123a of a second capacitor, all on a tape 145.

Figure 1C:
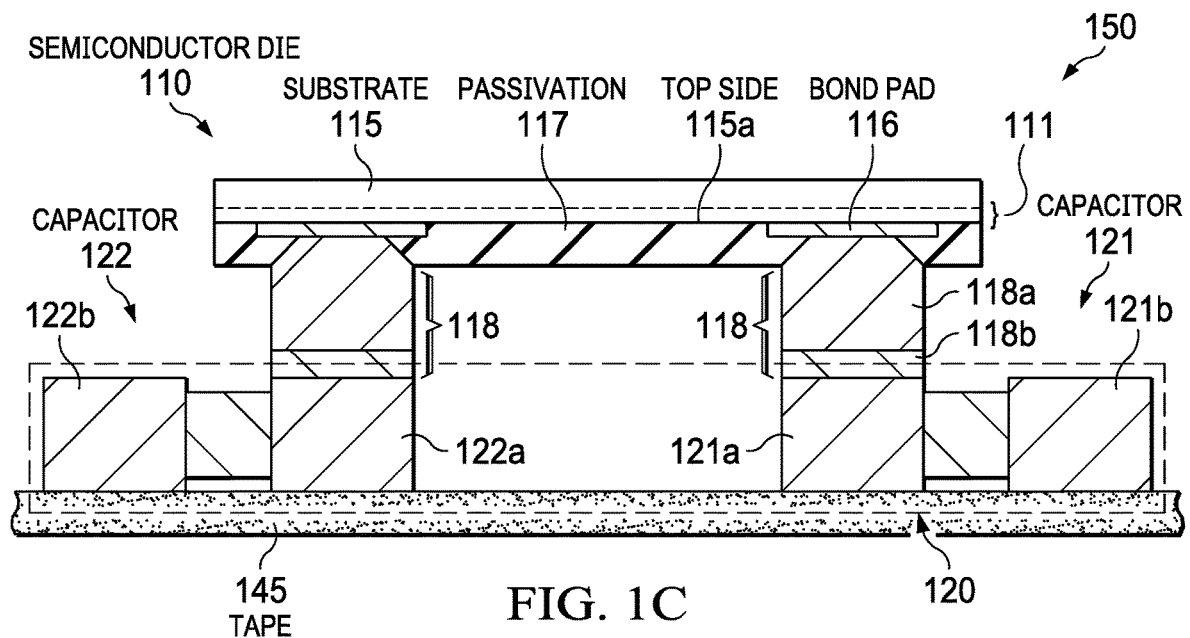
FIG. 1C is a front view (e.g., showing the width direction of the package) of another in-process semiconductor package again having 6 pins with a plurality of capacitors and metal bars as pre-singulated leads or lead terminals showing its pre-singulated leads or lead terminals as a first capacitor and a second capacitor, all on a tape, after a semiconductor die is flipchip placed on the pre-singulated leads or lead terminals.

FIG. 1C is a front view (e.g., showing the width direction of the package) of an in-process semiconductor package 150 according to another arrangement again having 6 pins with passive devices and metal bars as leads comprising a semiconductor die 110 after being placed (e.g., by a pick and place apparatus) with its bonding features 118 onto the pre-singulated leads shown as the metal end caps 121a, 122a of a first capacitor 121 and a second capacitor 122, respectively, on a tape 145. As before, the bonding of the semiconductor die 110 to the metal end caps 121a, 122a provides electrical contact to one of the electrodes of their respective capacitor.

Figure 1D:
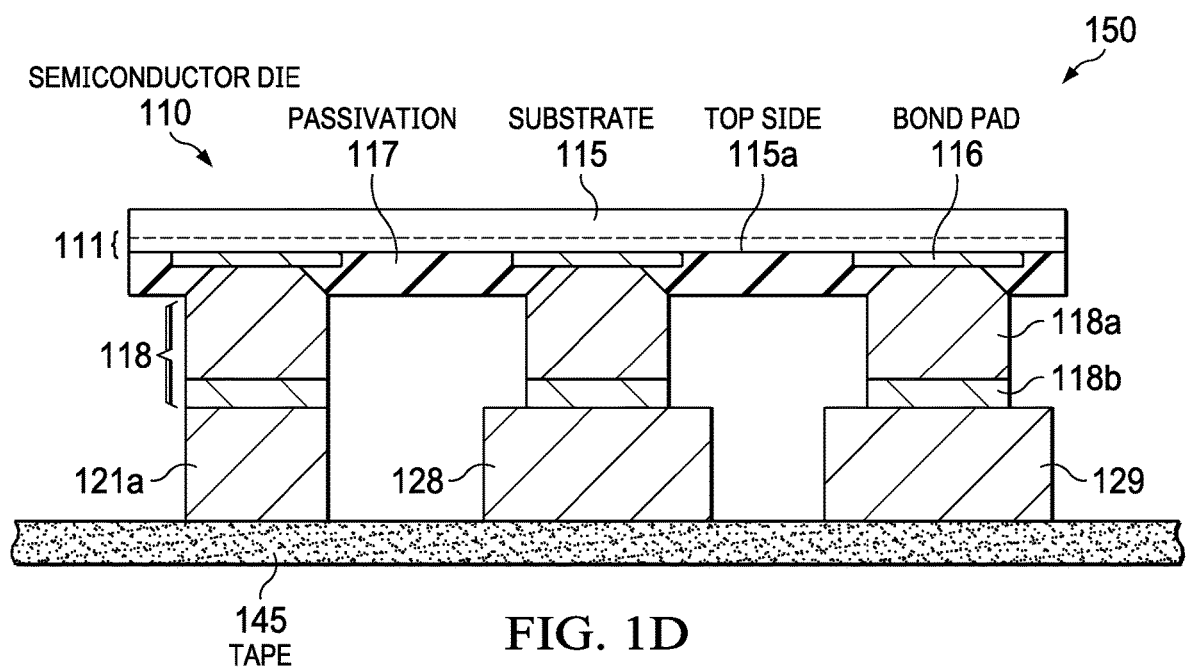
FIG. 1D shows a side view (of the in-process semiconductor package shown in FIG. 1C showing its 3 pre-singulated leads or lead terminals in the length direction being a capacitor, a first metal bar, and a second metal bar, all on a tape.

FIG. 1D shows a side view (e.g., showing the length direction of the package) of the in-process semiconductor package 150 shown in FIG. 1C showing its 3 pre-singulated leads or lead terminals in the length direction. The pre-singulated leads or lead terminals shown comprise a metal end cap 121a of a first capacitor, a first metal bar 128, and a second metal bar 129, all on a tape 145.

Figure 2A:
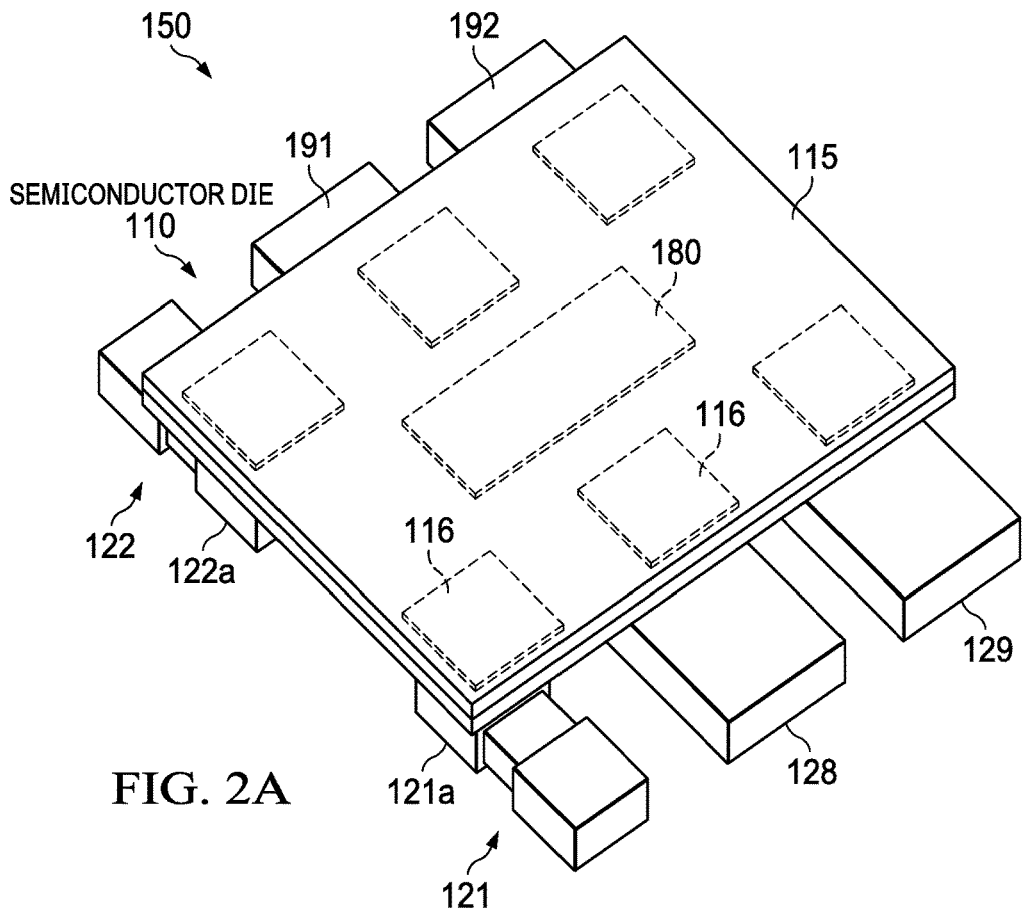
FIG. 2A is a perspective view depiction of the 6 pin packaged semiconductor device shown in FIGS. 1C and 1D including at least one IC die having its bonding features flipchip bonded to a pre-singulated leadframe shown comprising 2 capacitors and 4 metal bars.
Figure 2B:
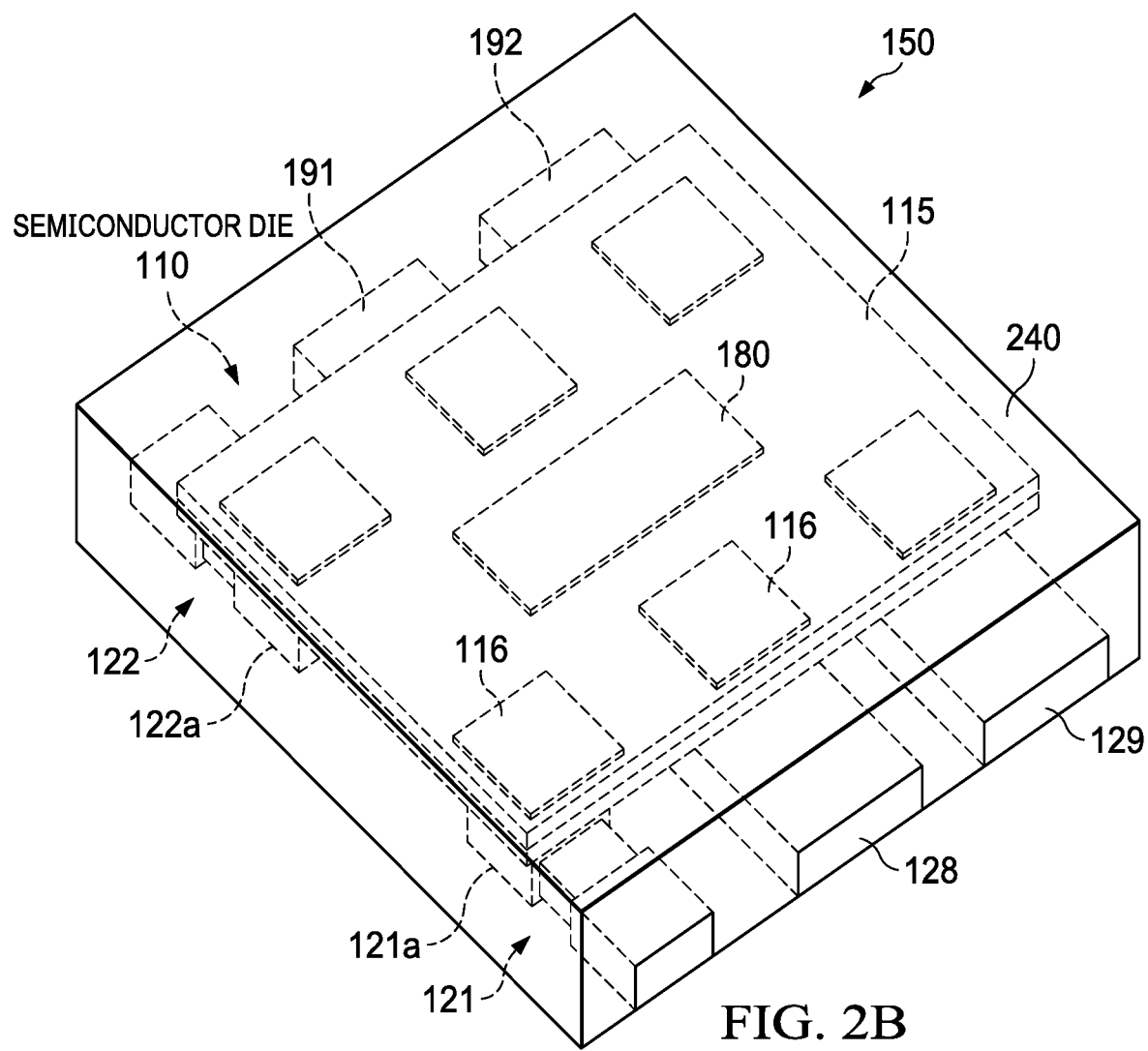
FIG. 2B is a perspective view depiction of the 6 pin packaged semiconductor device shown in FIG. 2A flipchip bonded to a pre-singulated leadframe shown comprising 2 capacitors and 4 metal bars, now after molding with a mold compound.

FIG. 2A is a perspective see-through view depiction of an example 6 pin packaged semiconductor device shown in FIGS. 1C and 1D including at least one semiconductor die 110 having its bonding features 118 on bond pads 116 shown being bonded to a pre-singulated leadframe shown comprising 4 metal bars 128, 129, 191, 192 and to the end caps 121a and 122a of capacitors 121 and 122, respectively. The substrate 115 having circuitry 180 with bond pads 116 is shown for the semiconductor die 110. Although no housing is shown in FIG. 2A, there is generally a molded housing included, such as shown in FIG. 2B which is a perspective view depiction of the 6 pin packaged semiconductor device 150 shown in FIG. 2A flipchip bonded to the pre-singulated leadframe shown comprising 2 capacitors and 4 metal bars, with a mold compound 240 shown after molding. The packaged semiconductor device 150 shown in FIG. 2B can be seen to be in a QFN form where the lead terminals are exposed on the bottom and sides of the package as with a QFN.

Figure 3:
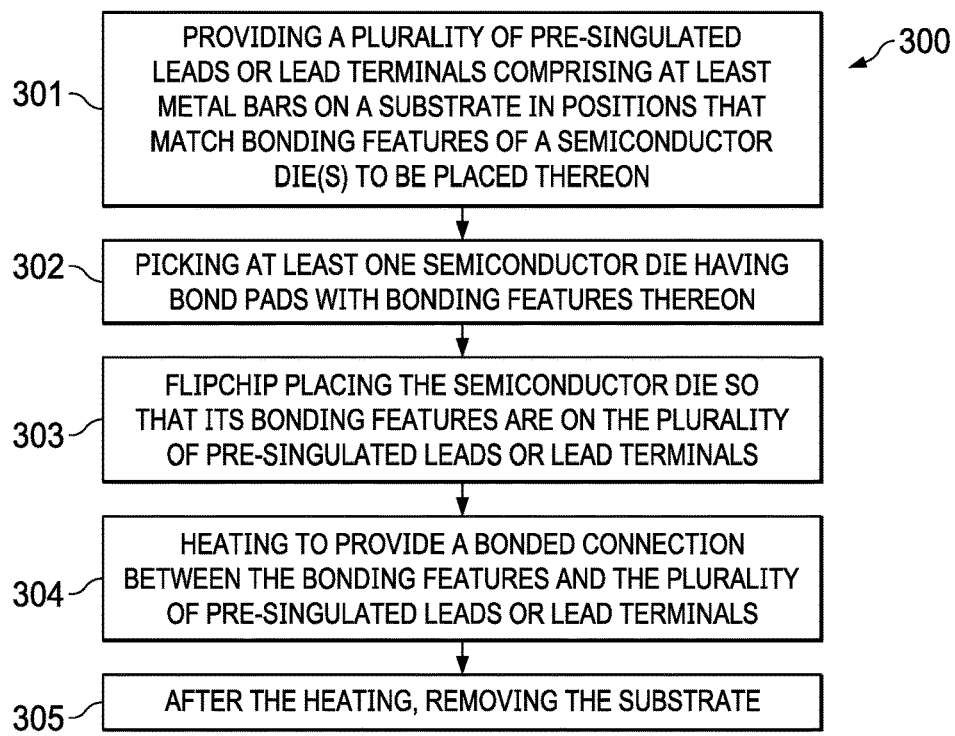
FIG. 3 is a flow chart that shows steps in a disclosed method of semiconductor device assembly that includes utilizing a disclosed pre-singulated leadframe.

FIG. 3 is a flow chart that shows steps in a disclosed method 300 of packaged semiconductor device assembly. Step 301 comprises providing (such as by picking and placing) a plurality of pre-singulated leads or lead terminals comprising at least metal bars with optional passive device(s) having a top side bondable terminal with its bottom side on a substrate (e.g., a tape or a polymer that provides adhesion) in positions that match the bond pads and thus the bonding features of a semiconductor die(s) to be placed thereon. The semiconductor die has circuitry with circuit nodes coupled to bond pads with the bonding features thereon. Although for disclosed leadframes there is generally a combination of metal bars and passive devices, there can be only metal bars, where the lead positions that are designed for passive devices are left open so that a customer can place semiconductor die onto their own passive devices on their own circuit board. This would mean the customer already places the passives on their circuit board and is just placing the semiconductor die onto the passives. The substrate for holding the pre-singulated leads can be a tape that is tolerant of a solder reflow temperature, which for a Pb-Free (Sn/Ag) solder is typically about 240-250° C., with about 40 to 80 seconds being over 220° C.

Step 302 comprises picking (e.g., using a nozzle of a SMT component placement system machine) at least one semiconductor die having bond pads with solder features (solder capped generally copper posts/pillars or solder balls) thereon. Step 303 comprises flipchip placing the semiconductor die so that its bonding features are on the plurality of pre-singulated leads or lead terminals (e.g., on the metal bars or on the bondable terminals of the passive devices). The pick and place apparatus can be modified to have multiple heads for picking and placement of multiple bars or passives at a given time.

Step 304 comprises heating to provide a bonded connection between the bonding features and the plurality of pre-singulated leads or lead terminals. Step 305 comprises after the heating, removing the substrate such as a tape. Because method 300 does not utilize a saw operation, there are no conventional "burs" from the mechanical or laser saw on the edges of leads or lead terminals. For example, the metal bars are generally punched out metal bars so that they lack burs.

There are significant advantages of disclosed leadframes comprising pre-singulated leads including advantages for using the passive devices and for using the metal bars. Since disclosed pre-singulated leads are supported under them by a substrate such as a tape, designing a lead in a longer shape or having multiple turns in the x,y position is possible rather than only being supported by a cantilever style lead on a conventional leadframe.

Advantages for including passive devices as at least one pre-singulated lead include a smaller overall package footprint enabled by placing the die(s) directly on the passive(s), and shrinking a customer's x,y footprint on their circuit boards. There is also less routing inside the package or through the customer's circuit board. The Customer also has the option to mount the semiconductor die directly on the passives on their own SMT component placement system or within the package manufacturer's SMT system. Moreover, there is a material cost savings inside the package by saving on the volume of mold, routing, and additional leads. More room is also provided inside a disclosed package to add other semiconductor die or add additional passives, or larger sized passives which may provide better device performance.

Advantages for using disclosed metal bars include speeding up package saw throughput by not having to cut through the saw streets of a conventional metal leadframe, which can be estimated to provide about a 30% to 40% saw cost reduction. The saw blade life thus is also extended, which thus uses less saw blades over time. This arrangement allows for the placement of complex designed leads or lead terminals.

EXAMPLES

Disclosed aspects are further illustrated by the following specific Examples, which should not be construed as limiting the scope or content of this Disclosure in any way.

In one example, the semiconductor die has bonding features comprising solder capped pillars on the bond pads of a semiconductor die arranged as a Wafer Chip-Scale Package (WCSP) 6 pin array, and the disclosed leadframe with pre-singulated leads or lead terminals can be configured as a pico chip-scale package (CSP) 6 pin array. The package however as described above can have any number of pins. One example for the CSP can be based on FIGS. 2A, 2B with 4 metal bars and 2 capacitors as the pre-singulated leads or lead terminals.

One specific example packaged semiconductor device that disclosed aspects can be applied to is the HOTROD QFN package from Texas Instruments Incorporated that is generally used for power devices, which is a thermally enhanced plastic package that uses a copper leadframe technology including input/output (TO) lead terminals and power busses that eliminates power device wire bonds by flipchip attaching the power device and/or die directly to lead terminals and power busses of the leadframe. Everywhere there are lead terminals in this QFN package they can be replaced by pre-singulated leads or passives. Disclosed metal bars configured as power leads can also be used for the power busses that can be picked and placed on a tape during the same placement used for the other pre-singulated bars or passives.

Disclosed aspects can be integrated into a variety of assembly flows to form a variety of different semiconductor packaged devices and related products. The assembly can comprise single semiconductor die or multiple semiconductor die, such as PoP configurations comprising a plurality of stacked semiconductor die or laterally placed semiconductor die. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:
1. A packaged semiconductor device, comprising:
a plurality of pre-singulated leads or lead terminals comprising at least metal bars on a substrate that holds the metal bars in position on the substrate;

at least one semiconductor die having circuitry with circuit nodes coupled to bond pads with bonding features thereon; and the semiconductor die bonding features are bonded to the plurality of pre-singulated leads or lead terminals.

2. The packaged semiconductor device of claim 1, wherein the plurality of pre-singulated leads or lead terminals provide a planarity of ≤0.05 mm.

3. The package semiconductor device of claim 1, wherein at least one of the metal bars extends horizontally away from a bond pad to which it is coupled.

4. The packaged semiconductor device of claim 1, wherein the bonding features comprise solder capped copper pillars.

5. The package semiconductor device of claim 1, wherein at least one of the metal bars has a width greater than height.

6. The packaged semiconductor device of claim 1, wherein the plurality of pre-singulated leads or lead terminals further comprise at least one passive device having a top side bondable terminal.

7. The packaged semiconductor device of claim 6, wherein the passive device comprises a plurality of the surface mount capacitors.

8. The packaged semiconductor device of claim 6, wherein the passive device comprises a surface mount capacitor.

9. The packaged semiconductor device of claim 1, wherein the substrate comprises a tape.

10. The packaged semiconductor device of claim 9, wherein the tape is part of a tape and reel apparatus that has an associated computing device having an accessible memory that includes stored information regarding the semiconductor die including a number and a placement of the bond pads.

11. The packaged semiconductor device of claim 9, wherein the tape comprises a material that is tolerant of a solder reflow at a temperature of at least 220° C.

12. A packaged semiconductor device, comprising:
at least one semiconductor die having circuitry with circuit nodes coupled to bond pads with bonding features thereon;
a plurality of leads or lead terminals comprising at least metal bars, wherein the plurality of leads or lead terminals are exclusive of any saw marks; and
wherein the semiconductor die is flipchip attached with a bonded connection between respective ones of the bonding features and respective ones of the plurality of leads or lead terminals.

13. The package semiconductor device of claim 12, wherein at least one of the metal bars extends horizontally away from a bond pad to which it is coupled.

14. The packaged semiconductor device of claim 12, wherein the plurality of leads or lead terminals provide a planarity of ≤0.05 mm.

15. The package semiconductor device of claim 12, wherein at least one of the metal bars has a width greater than height.

16. The packaged semiconductor device of claim 12, further comprising a mold material for providing encapsulation.

17. The packaged semiconductor device of claim 12, wherein the bonding features comprise solder comprising features.

18. The packaged semiconductor device of claim 17, wherein the solder comprising features comprise solder capped copper pillars.

19. The packaged semiconductor device of claim 12, wherein the plurality of leads or lead terminals further comprise at least one passive device having a top side bondable terminal.

20. The packaged semiconductor device of claim 19, wherein the passive device comprises a surface mount capacitor.

21. The packaged semiconductor device of claim 20, wherein the passive device comprises a plurality of the surface mount capacitors.

22. A packaged semiconductor device, comprising:
at least one semiconductor die having circuitry with circuit nodes coupled to bond pads with solder features thereon;
a plurality of leads or lead terminals comprising metal bars and at least one passive device having a top side bondable terminal, wherein the plurality of leads or lead terminals are exclusive of any saw marks;
wherein the semiconductor die is flipchip attached with a bond between respective ones of the solder features and respective ones of the plurality of leads or lead terminals.

23. The package semiconductor device of claim 22, wherein at least one of the metal bars extends horizontally away from a bond pad to which it is coupled.

24. The package semiconductor device of claim 22, wherein at least one of the metal bars has a width greater than height.

25. A packaged semiconductor device, comprising:
a plurality of pre-singulated leads or lead terminals comprising at least one metal bar;
at least one semiconductor die having circuitry with circuit nodes coupled to bond pads with bonding features thereon;
the semiconductor die bonding features are bonded to the plurality of pre-singulated leads or lead terminals; and
mold material covering the at least one semiconductor die, bonding features and at least a portion of the plurality of pre-singulated leads or lead terminals.

26. The packaged semiconductor device of claim 25, wherein the plurality of pre-singulated leads or lead terminals provide a planarity of ≤0.05 mm.

27. The package semiconductor device of claim 25, wherein the at least one metal bar extends horizontally away from a bond pad to which it is coupled.

28. The package semiconductor device of claim 25, wherein the at least one metal bar has a width greater than height.

29. The packaged semiconductor device of claim 25, wherein the bonding features comprise solder capped copper pillars.

30. The packaged semiconductor device of claim 25, wherein the plurality of pre-singulated leads or lead terminals further comprise at least one passive device having a top side bondable terminal.

31. The packaged semiconductor device of claim 30, wherein the passive device comprises a plurality of the surface mount capacitors.

32. The packaged semiconductor device of claim 30, wherein the passive device comprises a surface mount capacitor.

* * * * *